United States Patent
Chen et al.

(10) Patent No.: US 7,094,658 B2
(45) Date of Patent: Aug. 22, 2006

(54) 3-STAGE METHOD FOR FORMING DEEP TRENCH STRUCTURE AND DEEP TRENCH CAPACITOR

(75) Inventors: Meng-Hung Chen, Taoyuan (TW); Shian-Jyh Lin, Yonghe (TW)

(73) Assignee: NANYA Technology Corporation, Taoyuan (TW)

( * ) Notice: Subject to any disclaimer, the term of this patent is extended or adjusted under 35 U.S.C. 154(b) by 164 days.

(21) Appl. No.: 10/816,820

(22) Filed: Apr. 5, 2004

(65) Prior Publication Data

US 2005/0221616 A1  Oct. 6, 2005

(51) Int. Cl.
*H01L 21/20* (2006.01)

(52) U.S. Cl. .................. 438/386; 438/387; 438/389; 438/390; 438/392

(58) Field of Classification Search .............. None
See application file for complete search history.

(56) References Cited

U.S. PATENT DOCUMENTS

| 6,071,823 | A | * | 6/2000 | Hung et al. | ............... | 438/714 |
| 6,387,773 | B1 | * | 5/2002 | Engelhardt | ............... | 438/386 |
| 2002/0132422 | A1 | * | 9/2002 | Ranade et al. | ............... | 438/243 |
| 2003/0211686 | A1 | * | 11/2003 | Panda et al. | ............... | 438/243 |

\* cited by examiner

*Primary Examiner*—Duy-Vu N Deo
(74) *Attorney, Agent, or Firm*—Bacon & Thomas, PLLC

(57) ABSTRACT

A method for forming a deep trench structure comprises the steps of providing a silicon substrate; forming a mask layer of a predetermined pattern on the silicon substrate to expose a portion of the silicon substrate; forming a first trench in the exposed portion of the silicon substrate, the first trench having a first depth; forming a nitride layer on the surfaces of the whole structure; forming a second trench in the first trench downward, the second trench having a second depth greater than the first depth; forming another nitride layer on the surfaces of the whole structure; and forming a third trench in the second trench downward, the third trench having a third depth greater than the second depth. The method of the present invention can make the whole trench have better etch uniformity, thereby obtaining good electrical performance.

18 Claims, 3 Drawing Sheets

3-STAGE METHOD FOR FORMING DEEP TRENCH STRUCTURE AND DEEP TRENCH CAPACITOR

BACKGROUND OF THE INVENTION

1. Field of the Invention

The present invention relates to a semiconductor process, more specifically, to a method for forming a deep trench structure and a deep trench capacitor.

2. Description of the Prior Art

Deep trench capacitors have been widely employed in the conventional semiconductor memory (such as DRAM) process, in order to reduce the occupied areas and to increase capacitances. In general, the formation of a deep trench capacitor is completed by forming a deep trench with desired depth (e.g., 7–8 μm) in a substrate once, followed by implementing some steps, including deposition, photoresist, etching, etc, several times, to form the buried plate (BP) (i.e., the bottom electrode), dielectric layer, upper electrode, collar oxide layer, connection electrode, and buried strap (BS) separately.

However, because the aforementioned deep trench process is restricted in process capability with the gradual shrinking of the dimension of components, particularly in sub-90 μm process, the etching uniformity inside the trench becomes worse, thereby influencing the overall electrical performance of the capacitors.

Therefore, a need for overcoming the above problem is required. The present invention fulfils this need.

SUMMARY OF THE INVENTION

A purpose of the present invention is to provide a method for forming a deep trench structure, which can make the whole trench have better etching uniformity and further obtain better electrical performance.

In accordance with an aspect of the present invention, a method for forming a trench structure comprises steps of providing a substrate; forming a mask layer of a predetermined pattern on the substrate to expose a portion of the substrate; forming a first trench in the exposed portion of the substrate, the first trench having a first depth; forming a first protection layer on the surfaces of the whole structure; forming a second trench in the first trench downward, the second trench having a second depth greater than the first depth; forming a second protection layer on the surfaces of the whole structure; and forming a third trench in the second trench downward, the third trench having a third depth greater than the second depth.

In accordance with another aspect of the present invention, a method for forming a trench capacitor comprises steps of providing a substrate; forming a mask layer of a predetermined pattern on the substrate to expose a portion of the substrate, the mask layer comprising an oxide layer; forming a first trench in the exposed portion of the substrate, the first trench having a first depth; forming a first protection layer on the surfaces of the whole structure; forming a second trench in the first trench downward, the second trench having a second depth greater than the first depth; forming an insulation layer on the surface of the second trench; forming a second protection layer on the surfaces of the whole structure; forming a third trench in the second trench downward, the third trench having a third depth greater than the second depth; forming a conductive diffusion region in the substrate of the periphery of the third trench; removing the first protection layer and the second protection layer; forming a dielectric layer on the surfaces of the overall structure; filling all the trenches with a first conductive layer, and making the height of the first conductive layer greater than the bottom of the oxide layer of the mask layer; removing the oxide layer of the mask layer; removing a portion of the first conductive layer to make the height of the left first conductive layer greater than the bottom of the insulation layer on the surface of the second trench; and removing the dielectric layer not covered by the first conductive layer.

In accordance with another aspect of the present invention, in the aforementioned methods, the first depth is substantially equal to the junction depth of a transistor adjacent to the first trench and formed subsequently.

In accordance with another aspect of the present invention, in the aforementioned methods, the first depth is greater than 100 nm, the second depth is greater than 700 nm, and the sum of the first, the second, and the third depths is greater than 7 μm.

In accordance with another aspect of the present invention, in the aforementioned methods, the first protection layer and the second protection layer comprise a nitride layer each.

In accordance with another aspect of the present invention, in the aforementioned methods, the first conductive layer comprises a polysilicon layer.

BRIEF DESCRIPTION OF THE DRAWINGS

The following drawings are not drawn according to practical dimensions and ratios and are only for illustrating the mutual relationships between the respective portions. In addition, the like reference numbers indicate the similar elements.

DETAILED DESCRIPTION OF THE PREFERRED EMBODIMENT

An embodiment of the present invention will be described in detail with reference to the accompanying drawings FIGS. 1a to 1i, the schematical sectional drawings illustrating the respective steps of the process for forming a deep trench capacitor in accordance with the present invention.

Figures 1A, 1B, 1C:
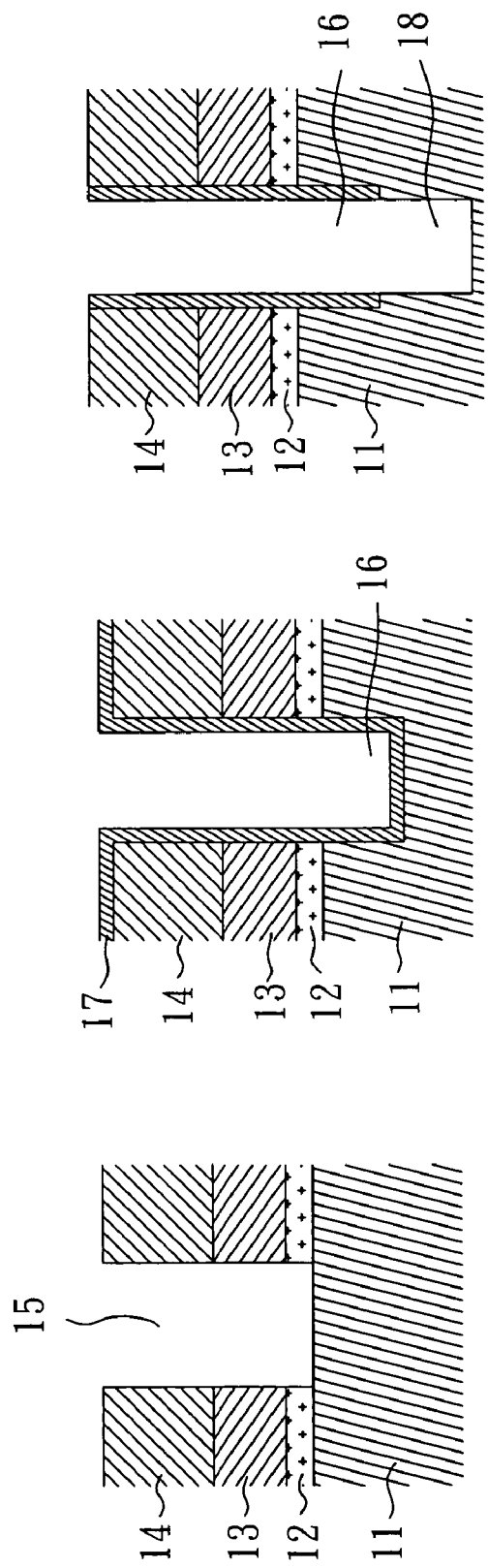
FIGS. 1a to 1i are the schematical sectional drawings illustrating the respective steps of the process for forming a deep trench capacitor in accordance with the present invention.

Please refer to FIG. 1a. On the substrate 11, which is usually a silicon substrate, a pad oxide layer 12 formed by thermal or deposition process, for example, a pad nitride layer 13 being usually SiN, and an oxide layer 14 being usually TEOS are formed, and then an opening 15 with a predetermined pattern is formed in these layers by etching, for example, in order to define the location of the deep trench intended to be formed in the substrate. The critical dimension (CD) of the opening 15 is for example about 130 nm. These layers as a whole are used as a mask layer in the subsequent procedures for forming a deep trench.

Then, as shown in FIG. 1b, a trench 16 is formed in the substrate 11 exposed to the opening 15 by for example etching, and a protection layer 17 such as SiN is then formed on the surfaces of the whole structure, with the thickness of for example about 10 nm. Meanwhile the trench 16 has a critical dimension (CD) of about 110 nm, and has a depth substantially at least equal to the junction depth of a transistor adjacent to the trench 16 and subsequently formed, for example of 130 nm, to benefit the subsequent connection of the buried strap (BS) formed in the trench 16 and its adjacent transistor.

As shown in FIG. 1c, a trench 18 is formed in the trench 16 downward by for example etching, having a depth greater than the depth of the trench 16, and the sum of the two depths is for example about 900 nm. The side walls of trench 18 are where a collar oxide layer is formed upon to prevent the dopant in the doped conductive layer, for example, filling the trench 18 from improperly diffusing toward the substrate 11.

Later, with reference to FIG. 1d, optionally the substrate 11 with the thickness of for example about 17 nm can be removed on the side of the trench by for example wet etching, to make the critical dimension (CD) of the trench 18 become for example about 144 nm. The wet etching can be implemented by for example the SC1 and HF solutions. Then, a heat treatment such as local oxide (LOCOS) is applied to form a collar oxide layer 19 acting as an insulation layer with the thickness of for example about 17 nm, on the surface of the trench 18. A protection layer 20 for example SiN having a thickness of for example about 10 nm is subsequently formed on the surfaces of the whole structure by for example deposition. The critical dimension (CD) of the trench 18 is about 90 nm then.

In FIG. 1c, a trench 21 is formed in the trench 18 downward by for example etching, having a depth greater than the depth of the trench 18, and the sum of the depths of the trenches 16, 18, and 21 is for example about 7.2 µm. The critical dimension (CD) of the upper portion of the trench 21 is for example about 90 nm, and the one of the lower portion is for example about 80 nm.

Figure 1F:
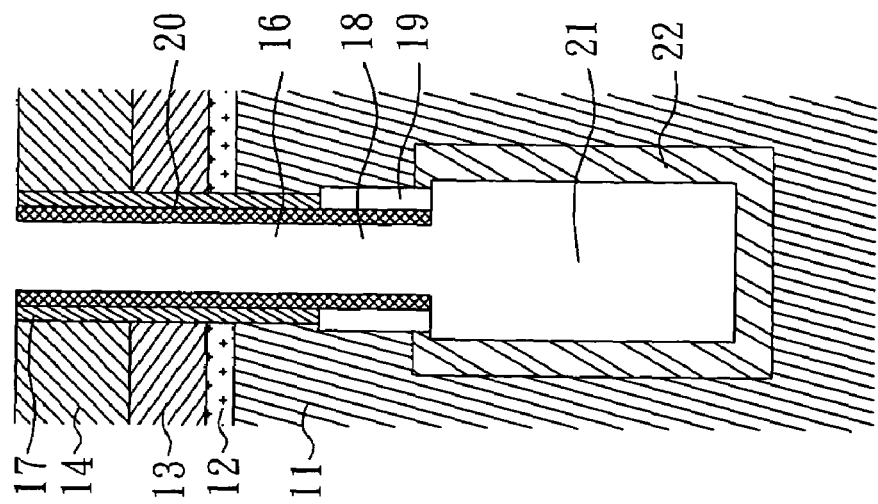
Figure 1E:
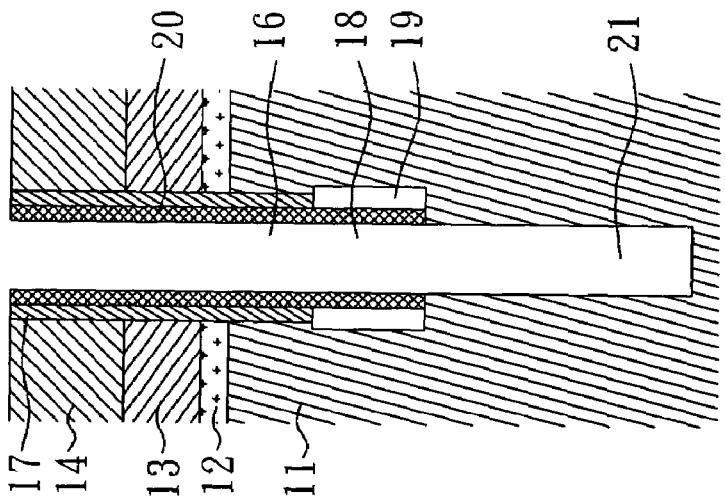
Figure 1D:
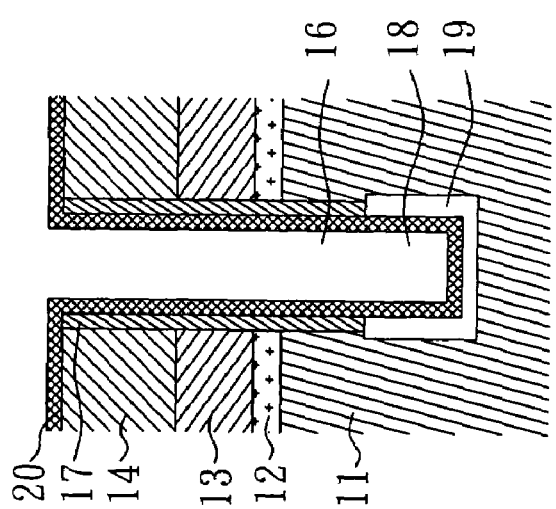

Then, as shown in FIG. 1f, optionally the substrate 11 with the thickness of for example about 30 nm can be removed on the side of the trench 21 by for example wet etching, to make the critical dimension (CD) of the upper portion of the trench 21 become for example about 150 nm, and the one of the lower portion for example about 140 nm. Following that, an arsenic silicon glass (ASG) layer (not shown) is formed on the surface of the trench 21 by for example deposition, and an oxide layer (not shown) for example TEOS is formed on the surfaces of the whole structure to prevent the ASG layer improperly diffusing outwards in the subsequent heat treatment. Also a drive-in treatment such as a heat treatment is implemented to form a conductive diffusion region 22, which is used as a bottom electrode of a capacitor (also referred to as buried plate, BP), in the substrate 11 of the periphery of the trench 21. Then the ASG layer and the TEOS layers are removed.

Figures 1G, 1H, 1I:
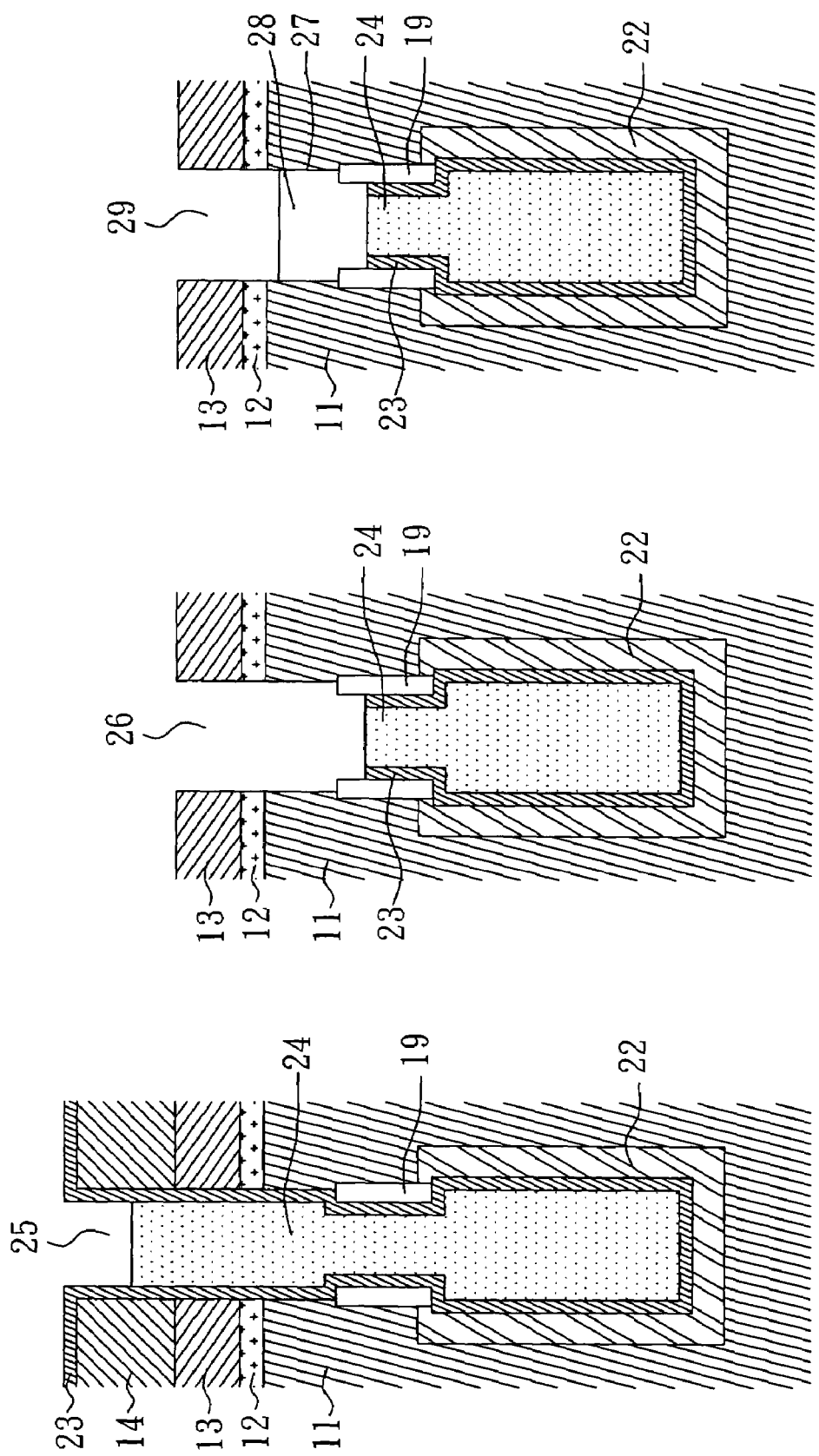

Please refer to FIG. 1g, in which the protection layers 17 and 20 have been removed, and a dielectric layer 23 such as SiN is formed on the surfaces of the whole structure by for example deposition to act as node dielectric with the thickness of several tens of angstrom (Å), for example 37 to 43 Å. And then the conductive layer 24 for example the doped polysilicon is filled into the opening 15 and the trenches 16, 18, and 21 by way such as deposition, and etched back up to the height greater than the height of the bottom of the oxide layer 14, to form an opening 25.

In FIG. 1h, the oxide layer 14 is removed by for example wet etch, and the conductive layer 24 is etched back up to the height greater than the height of the bottom of the insulation layer 19, to act as the upper electrode of a capacitor. Also the dielectric layer 23 not covered by the conductive layer 24 is removed to form an opening 26.

As shown in FIG. 1i, an interface layer 27 such as SiN is formed on the exposed surface of the substrate 11 in the opening 26 by for example deposition, having a height lower than the surface of the substrate 11. The thickness of the interface layer 27 is very thin and in general is of several angstroms only, for example 7 to 9 Å. Also a conductive layer 28 such as doped polysilicon is formed on the conductive layer 24 by for example deposition, with the height the same as the interface layer 27 so as to form an opening 29. The conductive layer 28 acts as a buried strap (BS) to connect the transistor formed in its adjacent active area. The interface layer 27 is used to prevent from the leak path resulting from the dislocation created on the interface between the conductive layer 28 and the substrate 11.

Based on the description above, it is clearly understood that because the depths of the trenches 16 and 18 formed earlier are much less than the depth of the trench 21 formed later, the method for forming deep trench capacitors in accordance with the present invention can make the trenches as a whole have better etching uniformity, so as to make the trench capacitors obtain great electrical performance. Besides, the collar oxide layer 19, and the conductive diffusion region 22, namely the bottom electrode or the buried plate (BP), can be formed in a self-aligned way so the complexity of the process for deep trench capacitors can be reduced.

While the embodiment of the present invention is illustrated and described, various modifications and alterations can be made by persons skilled in this art. The embodiment of the present invention is therefore described in an illustrative but not restrictive sense. It is intended that the present invention may not be limited to the particular forms as illustrated, and that all modifications and alterations which maintain the spirit and realm of the present invention are within the scope as defined in the appended claims.

What is claimed is:

1. A method for forming a trench structure comprising the steps of:
   forming a mask layer of a predetermined pattern on a substrate to expose a first portion of the substrate;
   forming a first trench in the first portion of the substrate, the first trench having a first depth;
   forming a first protection layer on the surface of the substrate;
   forming a second trench in the first trench downward to expose a second portion of the substrate, the second trench having a second depth greater than the first depth;
   forming an oxide layer covering the surface of the exposed second portion of the substrate;
   forming a second protection layer on the surface of the oxide layer; and
   forming a third trench in the second trench downward, the third trench having a third depth greater than the second depth.

2. The method as claimed in claim 1, wherein the first depth is substantially equal to the junction depth of a transistor adjacent to the first trench and formed subsequently.

3. The method as claimed in claim 1, wherein the first depth is greater than 100 nm.

4. The method as claimed in claim 1, wherein the first protection layer comprises a nitride layer.

5. The method as claimed in claim 1, wherein the second depth is greater than 700 nm.

6. The method as claimed in claim 1, wherein the second protection layer comprises a nitride layer.

7. The method as claimed in claim 1, wherein the sum of the first, second and third depths is greater than 7 µm.

8. A method for forming a trench capacitor comprising the steps of:

provide a substrate;

forming a mask layer of a predetermined pattern on the substrate to expose a portion of the substrate, the mask layer comprising an oxide layer;

forming a first trench in the exposed portion of the substrate, the first trench having a first depth;

forming a second trench in the first trench downward, the second trench having a second depth greater than the first depth;

forming a third trench in the second trench downward, the third trench having a third depth greater than the second depth;

forming a conductive diffusion region in the substrate of the periphery of the third trench;

removing the first protection layer and the second protection layer;

forming a dielectric layer on the surfaces of the overall structure;

filling all trenches with a first conductive layer, and making the height of the first conductive layer greater than the bottom of the oxide layer of the mask layer;

removing a portion of the first conductive layer to make the height of the left first conductive layer greater than the bottom of the insulation layer on the surface of the second trench; and removing the dielectric layer not covered by the first conductive layer.

9. The method as claimed in claim 8, further comprising the step of removing a portion of the substrate on the substrate of the second trench after the step of forming the second trench.

10. The method as claimed in claim 8, wherein the insulation layer on the surface of the second trench is an oxide layer.

11. The method as claimed in claim 10, wherein the oxide layer is formed by heat treatment.

12. The method as claimed in claim 8 further comprises the step of removing a portion of the substrate on the surface of the third trench, after the step of forming the third trench.

13. The method as claimed in claim 8, wherein the conductive diffusion region formed by Arsenic Silicon Glass (ASG) and heat treatment.

14. The method as claimed in claim 8, wherein the dielectric layer comprises a nitride layer.

15. The method as claimed in claim 8, wherein the first conductive layer comprises a polysilicon layer.

16. The method as claimed in claim 8 further comprising the steps of forming a third protection layer on the surfaces of the first trench and the second trench not covered by the first conductive layer to make its height lower than the surface of the substrate; and forming a second conductive layer on the first conductive layer to make its height equal to the third protection layer, after the step of removing the dielectric layer not covered by the first conductive layer.

17. The method as claimed in claim 16, wherein the third protection layer comprises a nitride layer.

18. The method as claimed in claim 16, wherein the second conductive layer comprises a polysilicon layer.

* * * * *